United States Patent
Leung

(10) Patent No.: US 7,607,112 B2
(45) Date of Patent: Oct. 20, 2009

(54) METHOD AND APPARATUS FOR PERFORMING METALIZATION IN AN INTEGRATED CIRCUIT PROCESS

(75) Inventor: Che Choi C. Leung, Bethlehem, PA (US)

(73) Assignee: Agere Systems, Inc., Allentown, PA (US)

( * ) Notice: Subject to any disclaimer, the term of this patent is extended or adjusted under 35 U.S.C. 154(b) by 400 days.

(21) Appl. No.: 11/609,509

(22) Filed: Dec. 12, 2006

(65) Prior Publication Data

US 2008/0135974 A1   Jun. 12, 2008

(51) Int. Cl.
*G06F 17/50* (2006.01)
(52) U.S. Cl. .................. 716/1; 716/2; 716/8; 716/9
(58) Field of Classification Search .............. 716/1, 716/2, 8, 913; 257/499
See application file for complete search history.

(56) References Cited

U.S. PATENT DOCUMENTS

| | | | | |
|---|---|---|---|---|
| 5,854,125 A | * | 12/1998 | Harvey | ............ 438/626 |
| 6,687,880 B2 | * | 2/2004 | Rivera et al. | ............ 716/1 |
| 6,867,127 B1 | * | 3/2005 | Hung | ............ 438/626 |
| 6,998,716 B2 | * | 2/2006 | Hung | ............ 257/773 |
| 7,365,413 B1 | * | 4/2008 | Kretchmer et al. | .......... 257/618 |
| 2005/0098895 A1 | * | 5/2005 | Hung | ............ 257/758 |

\* cited by examiner

*Primary Examiner*—Sun J Lin
(74) *Attorney, Agent, or Firm*—Daniel J. Santos; John M. Harman

(57) ABSTRACT

A reverse fill pattern is used in an integrated circuit (IC) that comprises a metal layer having slots formed therein in the shape of rhombuses. The distribution of rhombic slots ensures that electrical current is evenly distributed in the conductor, even at the edge regions of the conductor. This even distribution of rhombic slots ensures that electrical current is evenly distributed at least in the central region, and in most if not all cases, across the entire region of the conductor including the edge regions. Thus, the reverse fill pattern prevents current crowding. By preventing current crowding, more stringent metal distribution targets can be met without creating or exacerbating problems associated with IR drop and EM, and without having to add any extra metal to avoid such problems.

25 Claims, 6 Drawing Sheets

METHOD AND APPARATUS FOR PERFORMING METALIZATION IN AN INTEGRATED CIRCUIT PROCESS

TECHNICAL FIELD OF THE INVENTION

The invention relates to integrated circuits (ICs). More particularly, the invention relates to using a metallization process to form a metal reverse fill pattern in an IC that has a design that allows metal density targets to be achieved while preventing problems such as IR drop and electromigration (EM) from occurring.

BACKGROUND OF THE INVENTION

In IC manufacturing processes, metallization processes are used to form metal elements in the IC, such as, for example, busses, interconnects, vias, power distribution networks, etc. In these metal elements, it is necessary for the metal to be reasonably evenly distributed locally in order to ensure that the chemical mechanical polishing (CMP) process, which is used to polish interconnects and dielectric layers in the IC, produces reliable results. To ensure that the metal is evenly distributed locally, IC processes have certain metal density target requirements that must be met. For example, a particular IC process may require the layout to have a metal density in a range of 30% to 70% within a window that is 100 micrometers (microns)-by-100 microns in size as the window is stepped through the entire layout in steps that are 50 microns apart. A tool used during the process checks the metal density within the window as it is stepped through the layout to determine whether the metal density requirements have been met.

As the local metal density requirements become increasingly stringent, the window and step sizes become increasingly smaller. In particular, for IC processes that are capable of achieving nanoscale (e.g., 100 nanometers or less) geometries, the local metal density requirements are so stringent that they may not be met without reducing the conductor widths to an extent that problems associated with IR drop and EM begin to occur. IR drop is a drop in the voltage level being supplied to devices in the IC (e.g., logic gates), which may prevent the IC from operating properly. EM is a transfer of momentum from an electron to a metal ion as the electron passes by the metal ion as the electron moves through a metal conductor. This transfer of momentum can cause the metal ions in the IC to move from their original positions to the extent that physical damage to the conductor occurs, which may result in open circuits and other problems that prevent the IC from operating properly.

FIG. 1 illustrates a top view of a metal conductor runner 2 that has a known metallization pattern designed to meet metal distribution requirements of a particular IC process. The pattern is made up of a layer 3 of metal, such as copper, for example, having rectangular slots 4 formed in it where portions of the metal layer 3 have been removed in order to reduce the local metal density. The pattern is commonly referred to in the IC manufacturing industry as a reverse fill pattern. It is also known in the IC manufacturing industry to use fill, as opposed to reverse fill, patterns that are created by adding, as opposed to removing, metal in order to achieve a target local metal density. A reverse fill pattern is formed during a metallization process that etches away metal atoms to form the slots, which is followed by a CMP process.

In the reverse fill pattern shown in FIG. 1, the rectangular slots 4 are sized and spaced in the metal layer 3 to achieve a target local metal density. The slots 4 are rectangular in shape. Each slot 4 has two opposing lengthwise sides, ls1 and ls2, that are parallel to two opposing lengthwise sides, LS1 and LS2, of the runner 2. Each slot 4 has two opposing widthwise sides, ws1 and ws2, that are parallel to two opposing widthwise sides, WS1 and WS2, of the runner 2. Each slot 4 is separated in the widthwise and lengthwise directions from any adjacent slot 4 by a slot-to-slot spacing distance, S.

The metal runner 2 has a width, W, in the widthwise direction of the runner 2 and a length, L, in the lengthwise direction of the runner 2. The lengthwise and widthwise directions of the runner 2 are perpendicular to one another and to the lengthwise and widthwise directions, respectively, of the slots 4. Electrical current flows through the runner 2 in the lengthwise direction of the runner 2, as indicated by the arrow.

In order to meet stringent metal density requirements and, at the same time, make the runner width W large enough to prevent problems associated with IR drop and EM from occurring, the slot-to-slot spacing distance S is sometimes made very small. Reducing S generally results in a local decrease in the metal density. Eventually, however, this solution will not be adequate due to the fact that S cannot be decreased indefinitely, and metal density requirements are continually becoming increasingly stringent (i.e., window size is continually decreasing). Reducing S results in more area being consumed in the chip by the metal runner because as S is reduced, W generally must be increased in order to ensure that problems associated with IR drop and EM do not worsen.

Another problem associated with the reverse fill pattern shown in FIG. 1 is that it can result in current crowding. Current crowding is a term used to describe a nonhomogeneous distribution of current density in a conductor. Current crowding exacerbates EM and may lead to other problems that affect the performance of the IC, such as localized overheating and the formation of thermal hotspots.

Accordingly, a need exists for a reverse fill pattern that allows increasingly stringent local metal density requirements to be met without exacerbating problems associated with IR drop and EM.

SUMMARY OF THE INVENTION

The invention provides methods and apparatuses for designing and creating metal elements in ICs that have rhombic reverse fill patterns. An apparatus for designing a rhombic reverse fill pattern for a metal layer of an IC comprises a memory device and a processor. The processor is configured to perform a rhombic reverse fill pattern design algorithm that generates a reverse fill pattern design for one or more metal elements of the IC that meets a target metal density. The reverse fill pattern design includes a layer of metal having slots formed therein, each of which has is substantially rhombic in shape.

An apparatus for forming a rhombic reverse fill pattern in a metal layer of an IC comprises a memory device, a metallization machine and a processor. The processor is configured to perform a rhombic reverse fill pattern metallization algorithm that generates control signals for controlling a metallization process. The metallization machine receives the control signals and performs a metallization process that forms a reverse fill pattern in one or more metal layers of the IC. The reverse fill pattern meets a target metal density and includes a layer of metal having slots formed therein, each being substantially rhombic in shape.

A method for designing a rhombic reverse fill pattern for a metal layer of an IC comprises selecting a size value and a spacing distance value for substantially rhombic slots of a rhombic reverse fill pattern to meet a target metal density, and generating a rhombic reverse fill pattern design for a metal element of the IC using the selected size and spacing distance values. The reverse fill pattern design includes a layer of metal having the substantially rhombic slots formed therein, each having substantially the shape of a rhombus. The rhombuses have a size corresponding substantially to the selected size value, and adjacent slots are separated by substantially the selected spacing distance.

A method for forming a rhombic reverse fill pattern in a metal layer of an IC comprises receiving a rhombic reverse fill pattern design that meets a target metal density, and forming a rhombic reverse fill pattern in a metal layer of the IC having the rhombic reverse fill pattern design. The reverse fill pattern includes a layer of metal having slots formed therein, each slot being substantially rhombic in shape.

These and other features and advantages of the invention will become apparent from the following description, drawings and claims.

DETAILED DESCRIPTION OF AN ILLUSTRATIVE EMBODIMENT

In accordance with the invention, a reverse fill pattern is used that has slots formed in the shape of rhombuses. The rhombic slots preferably are evenly distributed in the conductor. This even distribution of rhombic slots ensures that electrical current is evenly distributed at least in the central region, and in most if not all cases, across the entire region of the conductor including the edge regions. Thus, the reverse fill pattern prevents current crowding. By preventing current crowding, more stringent metal distribution targets can be met without creating or exacerbating problems associated with IR drop and EM, and without having to add any extra metal to avoid such problems.

Figure 1:
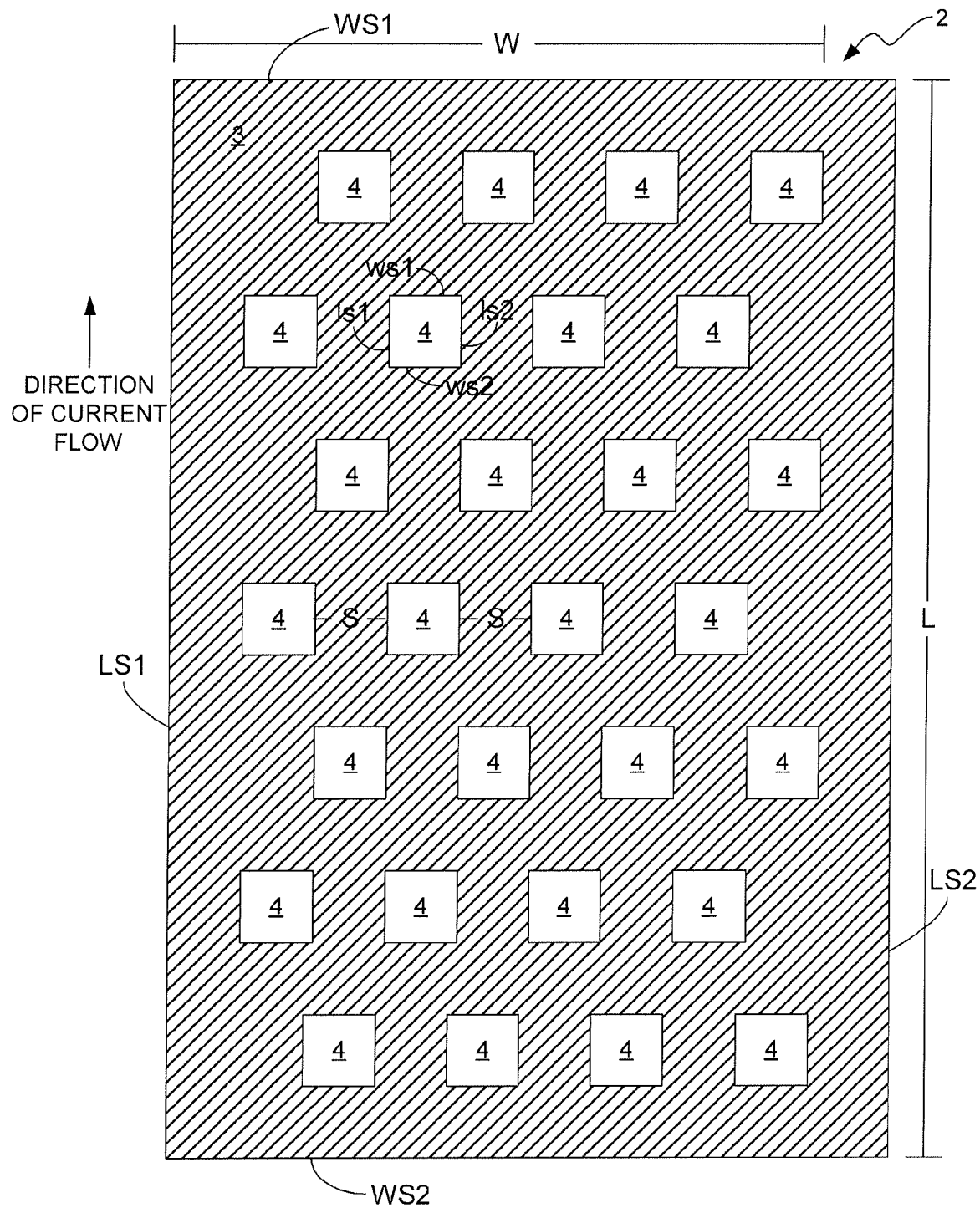
FIG. 1 illustrates a top view of a metal conductor runner that has a known reverse fill metallization pattern designed to meet metal distribution requirements of a particular semiconductor fabrication process.
Figure 2:
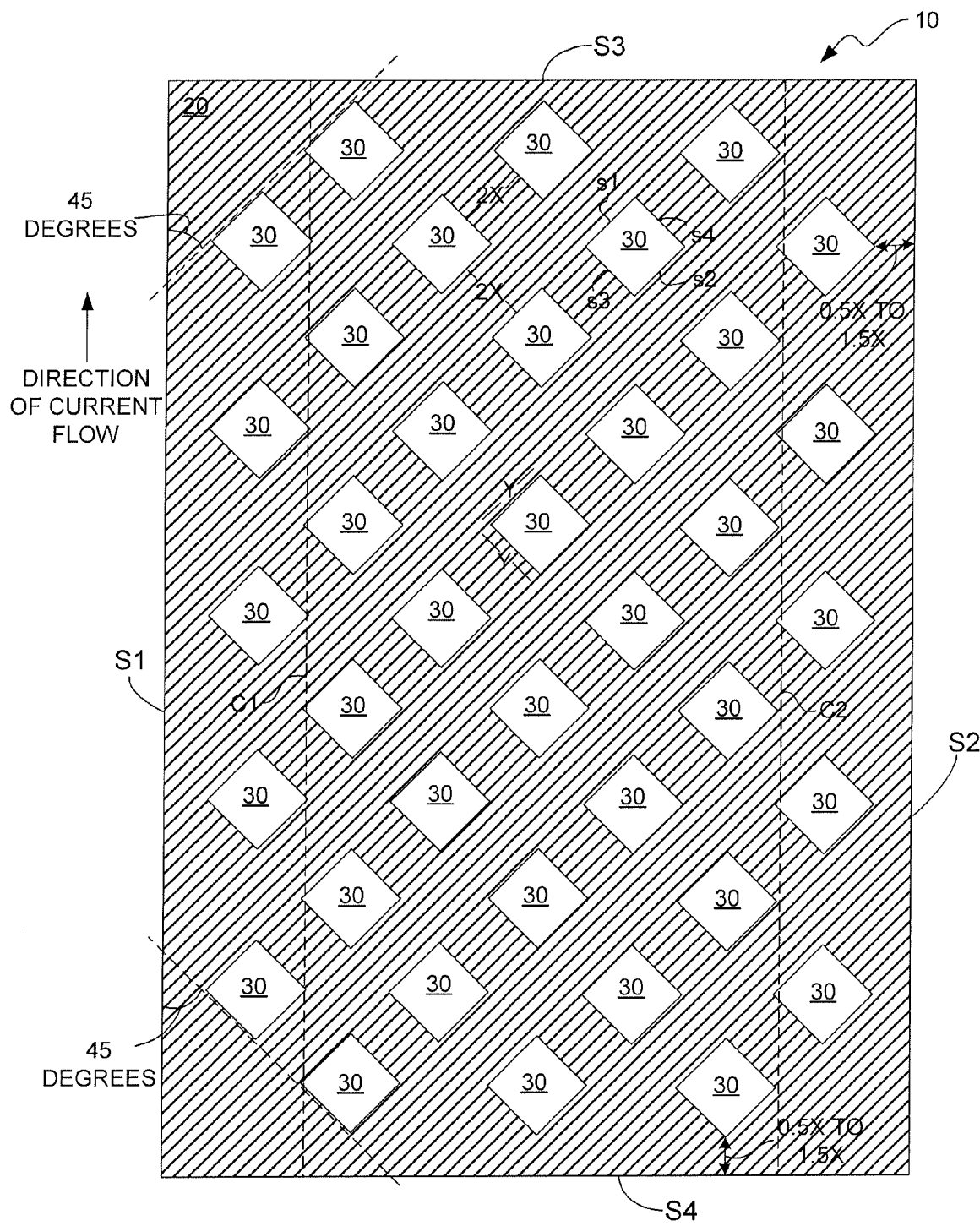
FIG. 2 illustrates a top view of a metal conductor runner that has a reverse fill metallization pattern in accordance with an illustrative embodiment of the invention.

FIG. 2 illustrates a top view of a metal conductor runner 10 that has a reverse fill metallization pattern in accordance with an illustrative embodiment of the invention that enables stringent metal distribution requirements to be met while also achieving the goals of preventing problems associated with IR drop, EM and current crowding. The reverse fill pattern of the runner 10 is made up of a layer of metal 20 having rhombic slots 30 formed in it. A rhombus is a quadrilateral in which all of the sides are of equal length, i.e., it is an equilateral quadrangle. In colloquial usage, the shape is often described as a diamond. In a rhombus, opposite sides are parallel. It should be noted, however, that when the rhombic slots are formed during fabrication, they may not be exactly rhombic in the mathematical sense due to various factors that may affect the precision of the manufacturing process, such as process tolerances, for example. Therefore, the term "substantially rhombic", as that term is used herein, is intended to denote a shape that is substantially that of a rhombus, but may not be precisely a rhombus when formed in the IC device due to process tolerances and other factors that are not limitations of the invention, but are limitations of the particular process used.

Each slot 30 has a sides s1 and s2 that are parallel to each other and sides s3 and s4 that are parallel to each other. The sides s1, s2, s3 and s4 are equal in length in accordance with the definition of a rhombus. The sides s1 and s2 may be perpendicular to sides s3 and s4, in which case the slots 30 are square rhombuses. The sides s1 and s2 may not be perpendicular to sides s3 and s4, in which case the rhombus is not a square rhombus. In accordance with the illustrative embodiment shown in FIG. 2, the sides s1 and s2 of each slot 30 are at 45° angles relative to the sides S1 and S2 of the runner 10. Likewise, the sides s3 and s4 of each slot 30 are at 45° angles relative to the sides S1 and S2 of the runner 10.

Preferably, the rhombic slots 30 are evenly spaced by a spacing distance of 2X, where X is any positive value. In accordance with the invention, it has been determined that evenly spacing the slots 30 results in an even distribution of electrical current at least in a central region of the conductor 10, which is depicted generally as the area between the dashed lines labeled C1 and C2. In most, if not all cases, the even spacing of the rhombic slots 30 also results in an even distribution of current along the side edge regions, i.e., the regions between the dashed lines C1 and C2 and the sides S1 and S2, respectively. In the edge regions, the rhombic slots 30 preferably are spaced a distance of between 0.5X to 1.5X from the sides S1, S2, S3 and S4.

The size, Y, of the slots 30 corresponds to the length of the sides s1, s2, s3 and s4 as Y=s1=s2=s3=s4. The values of X and Y are chosen to achieve the best process solutions. The ratio of Y/X is chosen based on the target metal density. A large Y/X ratio will result in a lower metal density. A small Y/X ratio will result in a higher metal density. The effective metal density in the central region of the conductor 10 is calculated as:

$$1-(Y)^2/(2X+Y)^2 = \text{effective metal density.} \quad \text{(Equation 1)}$$

For example, assuming a target metal density of Z %, where Z is some positive value, the Y/X ratio is obtained as:

$$1-(Y)^2/(2X+Y)^2 = Z/100. \quad \text{(Equation 2)}$$

Therefore, to achieve a target density of 60%, Eq. 2 is applied to yield a Y/X ratio of approximately 3.4. Values for Y and X are then chosen that achieve this ratio.

It should be noted that it is not a requirement of the invention that the rhombic slots 30 be shaped such that the sides s1, s2, s3 and s4 are at 45° angles relative to the sides S1 and S2. The reason that it is preferred that the sides s1, s2, s3 and s4 be at 45° angles relative to the sides S1 and S2 is that standard IC metallization processes are capable of forming devices at 45° angles and 90° angles. If some other angular orientation for the slots is chosen, the metallization process must be able to achieve the chosen angular orientation. Thus, although the sides s1 and s2 are shown in FIG. 2 as being perpendicular to sides s3 and s4, this is not a requirement of the invention. The invention applies equally to slots having other rhombic shapes, even though those shapes may not be compatible with standard IC metallization processes. The invention is not limited with respect to the manner in which the rhombic reverse fill pattern of the invention is created in the IC.

The invention also is not limited with respect to the types of metal elements that use the reverse fill pattern of the invention. The runner 10 is merely an example of one such element. The invention applies equally to any type of metal element including, for example, busses, interconnects, vias, runners, power distribution networks, etc.

Figure 3:
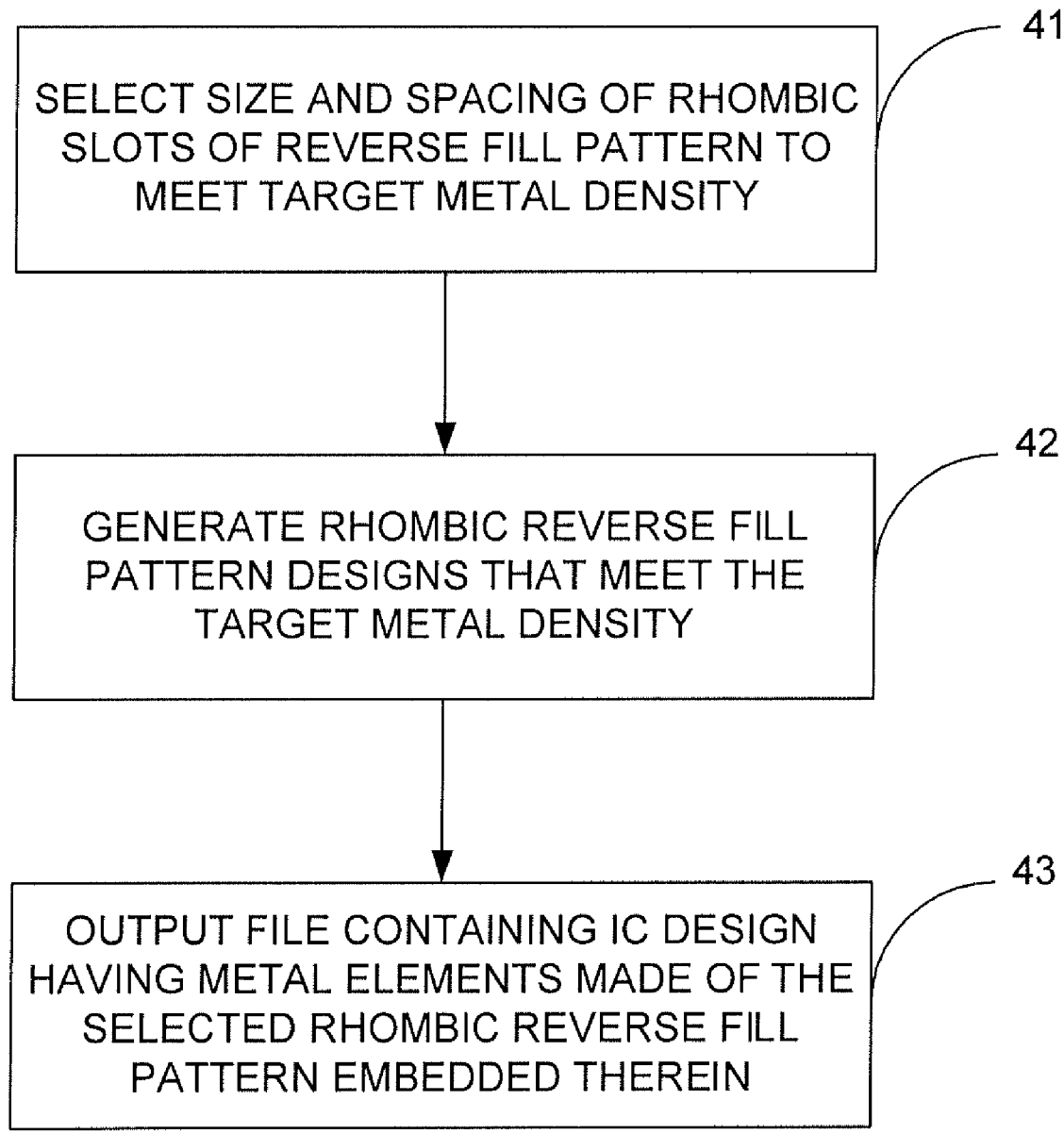
FIG. 3 illustrates a flowchart that represents the method of the invention in accordance with an illustrative embodiment for generating a rhombic reverse fill pattern design.

FIG. 3 illustrates a flowchart that represents the method of the invention in accordance with an illustrative embodiment for producing a rhombic reverse fill pattern design. As described above with reference to Equations 1 and 2, the size Y and spacing distance 2X are selected to meet the target metal density, as indicated by block 41. The process of selecting the values for Y and 2X is may be performed by hand or in hardware, software and/or firmware. Typically, a target metal density to be used for the metal devices of the IC is selected by a designer or group of designers. The IC typically will already have been designed at the time that the target metal density is selected. The IC design will be input to a computer aided design (CAD) tool, which a designer will use to design a rhombic reverse fill pattern for the metal devices of the IC design that achieves the target metal density. To accomplish this, the designer will typically input different values for Y and 2X into the CAD tool, which will create different rhombic reverse fill patterns that achieve the selected target metal density.

The CAD tool will generate IC designs that have the rhombic reverse fill pattern designs using the values input for Y and 2X, as indicated by block 42. These patterns will typically be displayed to the designer on a display device. The designer will then select one of the reverse fill pattern designs that meet the target metal density. Once the designer has selected the final reverse fill pattern design to be used, the CAD tool will output an electronic file that contains the IC design having metal elements formed of the final rhombic reverse fill pattern embedded therein, as indicated by block 43.

Figure 4:
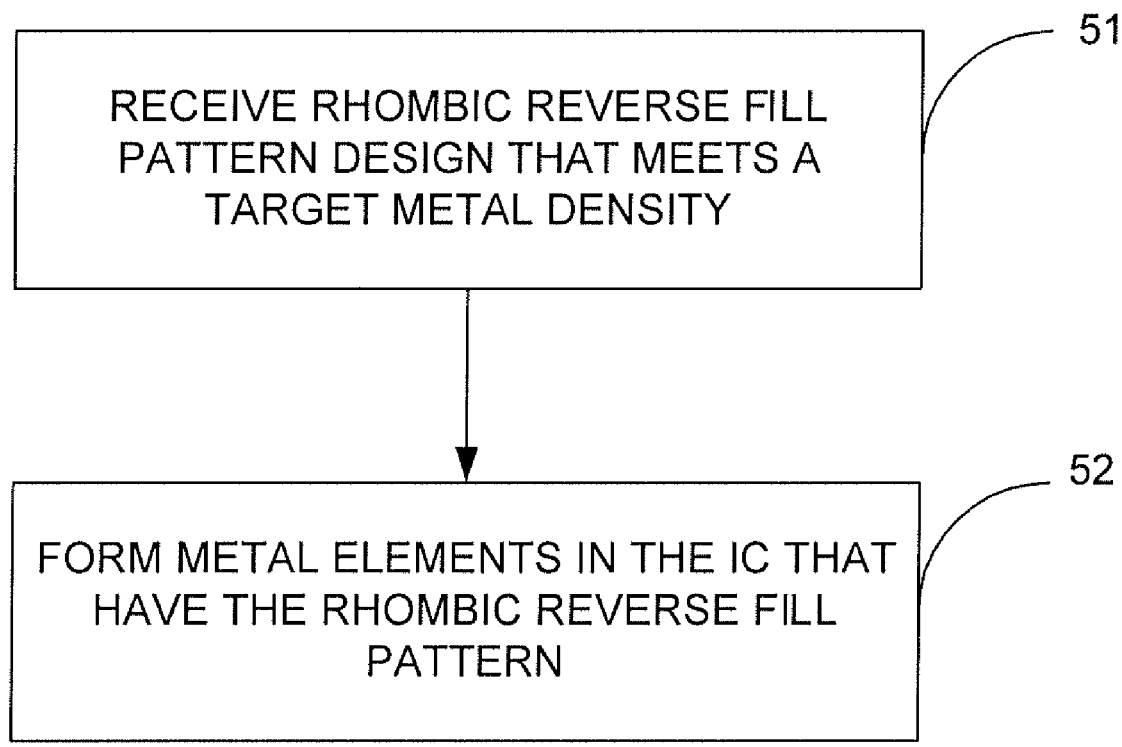
FIG. 4 illustrates a flowchart that represents the method of the invention in accordance with an illustrative embodiment for forming a rhombic reverse fill pattern in one or more metallization layers of an IC.

FIG. 4 illustrates a flowchart that represents the method of the invention in accordance with an illustrative embodiment for forming a rhombic reverse fill pattern in one or more metallization layers of an IC. Once the design has been generated by the process represented by the flowchart shown in FIG. 3, the data file may be input to a mask pattern creation system that uses the data file to create a mask that will be used during the metallization process by a metallization system to form the rhombic reverse fill patterns. Alternatively, the data file may be input directly to a metallization system that uses the data file directly to form metal elements in the IC that have the rhombic reverse fill pattern. Block 51 in FIG. 4 represents receiving the data file, either in the case where a mask pattern creation system receives the data file and uses it to create a mask or in the case where the data file is received by a metallization system that uses it directly to produce metal elements having the rhombic reverse fill pattern.

Block 52 in FIG. 4 represents the process of using the data file to produce metal elements in the IC that have the rhombic reverse fill pattern. This process corresponds to both cases described above with reference to block 51: (1) a mask that has been generated from the data file is used by the metallization system to produce metal elements in the IC that have the rhombic reverse fill pattern; or (2) the metallization system receives the data file directly and uses it to produce metal elements in the IC that have the rhombic reverse fill pattern.

Figure 5:
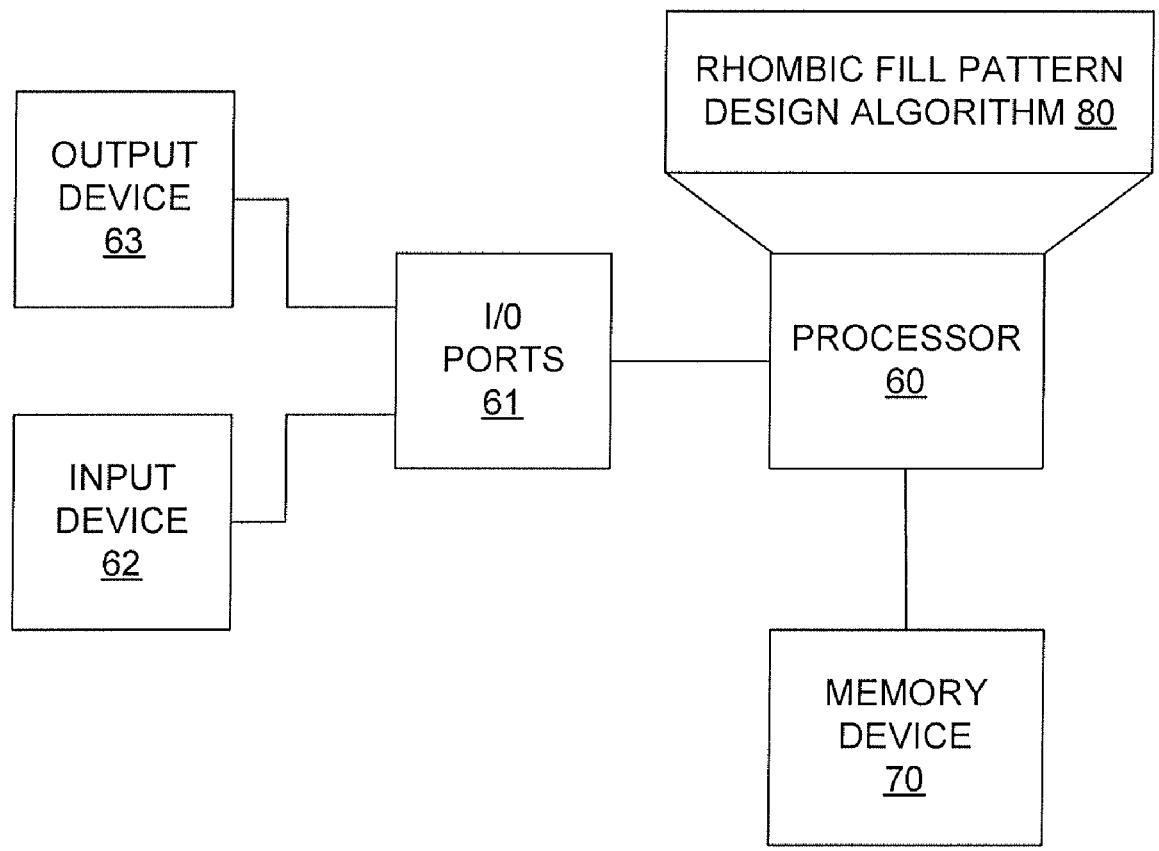
FIG. 5 illustrates a block diagram of the apparatus of the invention for performing the process represented by blocks 41 and 42 shown in FIG. 3 during the design of the metallization layer.

FIG. 5 illustrates a block diagram of the apparatus of the invention for performing the process represented by blocks 41-43 shown in FIG. 3 during the IC design phase. The apparatus includes a processor 60 and a memory device 70. The apparatus typically also includes one or more input/output (I/O) ports 61, an input device 62 (e.g., a keyboard) for inputting data to the processor 60, and an output device 63 (e.g., a display monitor) for outputting information to the designer to assist the designer in designing the rhombic reverse fill pattern. The processor 60 executes a rhombic fill pattern design algorithm 80 to perform the operations described above with reference to blocks 41-43. This algorithm 80 may be performed in software, hardware or a combination of software and hardware and/or firmware. The processor 60 is typically part of a CAD system that executes a CAD software program to generate the rhombic reverse fill pattern design and embed it in the IC design. The processor 60 may be any type of computational device, such as, for example, a microprocessor, a microcontroller, an application specific integrated circuit (ASIC), a programmable logic array (PLA), a programmable gate array (PGA), etc. The memory device 70 may be internal to or external to the processor 60 and may be any type of storage device, such as, for example, a random access memory device (RAM), dynamic RAM (DRAM), a read only memory (ROM), erasable programmable ROM (EPROM), flash memory, etc.

Figure 6:
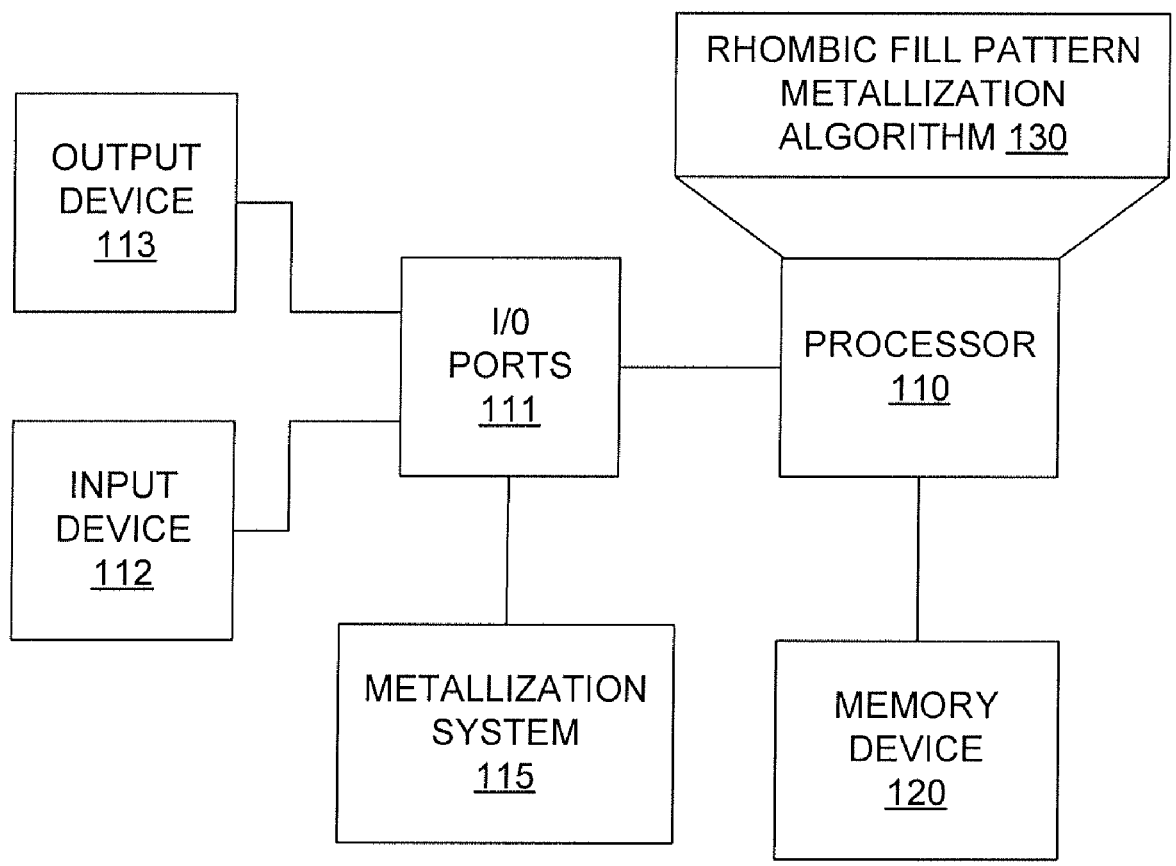
FIG. 6 illustrates a block diagram of the apparatus of the invention for performing the process represented by block 51 and 52 shown in FIG. 4 during the formation of the metallization layer.

FIG. 6 illustrates a block diagram of the metallization system of the invention for performing the process represented by blocks 51 and 52 shown in FIG. 4 during the fabrication of the metal layers. The metallization system includes a processor 110 and a memory device 120. The metallization system typically also includes one or more input/output (I/O) ports 111, an input device 112 (e.g., a keyboard, a disk drive, etc.), a metallization machine 115, and an output device 113 (e.g., a display monitor).

An example of the manner in which the metallization system shown in FIG. 6 operates is as follows. A data file containing an IC design having metal elements with the successful rhombic fill pattern design embedded therein is input to the apparatus via an input device 112 or via a network connection (not shown) connected to one of the I/O ports 111 through which the data file is downloaded to the system. The processor 110 receives the design and processes it in accordance with a metallization algorithm 130 to produce control signals, which the processor 110 outputs to a metallization machine 115. These signals cause the metallization machine 115 to perform the tasks necessary to form the metal elements having the rhombic reverse fill pattern. Alternatively, the data file may be used to create a mask that is then input via an input device or a network connection to the apparatus. In the latter case, the processor 110 processes the mask to generate control signals that are then delivered to the metallization machine 115 to cause it to perform the tasks necessary to form the metal elements having the rhombic reverse fill pattern.

The metallization algorithm 130 may be performed in software, hardware or a combination of software and hardware and/or firmware. The processor 110 may be any type of computational device, such as, for example, a microprocessor, a microcontroller, an application specific integrated circuit (ASIC), a programmable logic array (PLA), a programmable gate array (PGA), etc. The memory device 120 may be internal to or external to the processor 110 and may be any type of storage device, such as, for example, a random access memory device (RAM), a dynamic RAM (DRAM) device, a read only memory (ROM) device, an erasable programmable ROM (EPROM) device, a flash memory device, etc.

It should be noted that the invention has been described with reference to a few illustrative embodiments for the purpose of demonstrating the principles and concepts of the invention. The invention is not limited to these embodiments. As will be understood by persons skilled in the art, in view of the description provided herein, many variations may be made to the embodiments described herein and all such variations are within the scope of the invention.

What is claimed is:

1. An apparatus for designing a rhombic reverse fill pattern for a metal element of an integrated circuit (IC), the apparatus comprising:
   a memory device; and
   a processor, the processor being configured to perform a design algorithm of a rhombic reverse fill pattern design, the design algorithm generating a reverse fill pattern design for one or more metal elements of the IC that meets a target metal density, the reverse fill pattern design including a metal having slots formed therein, each slot being substantially rhombic in shape.

2. The apparatus of claim 1, wherein each slot has a size, Y, where Y is a positive value, and wherein adjacent slots are separated by a spacing distance, 2X, where X is a positive value, the values for Y and 2X being selected to ensure that the metal layer comprising the rhombic reverse fill pattern meets the target metal density.

3. The apparatus of claim 2, wherein the target metal density, Z, is related to X and Y as $(Y)^2/(2X+Y)^2=1-Z/100$, where Z is the target metal density stated in terms of a percentage.

4. The apparatus of claim 1, wherein each rhombic slot has a first side and a second side that are substantially parallel to each other and at substantially 45° angles relative to a side of the metal element, the side of the element being substantially parallel to a direction of current flow through the metal element.

5. The apparatus of claim 4, wherein said each rhombic slot has a third side and a fourth side that are substantially parallel to each other and substantially perpendicular to the first and second sides of said each rhombic slot, the third and fourth sides being at substantially 45° angles relative to the side of the metal element.

6. A metallization apparatus for forming a rhombic reverse fill pattern in a metal element of an integrated circuit (IC), the apparatus comprising:
   a memory device;
   a processor, the processor being configured to perform a metallization algorithm of a rhombic reverse fill pattern, the metallization algorithm generating control signals for controlling a metallization process;
   a metallization machine, the metallization machine receiving the control signals generated by the processor and performing a metallization process that forms a reverse fill pattern in one or more metal layers of the IC, the reverse fill pattern including a layer of metal having slots formed therein, each slot being substantially rhombic in shape, and wherein the reverse fill pattern meets a target metal density.

7. The apparatus of claim 6, wherein each slot has a size, Y, where Y, is a positive value, and wherein adjacent slots are separated by a spacing distance, 2X, where X is a positive value, the values for Y and 2X being selected prior to the rhombic reverse fill pattern being formed in a metal layer to ensure that a metal layer comprising the rhombic reverse fill pattern forming a metal element that meets the target metal density.

8. The apparatus of claim 7, wherein the target metal density is related to X and Y as $(Y)^2/(2X+Y)^2=1-Z/100$, where Z is the target metal density stated in terms of a percentage.

9. The apparatus of claim 6, wherein each rhombic slot has a first side and a second side that are substantially parallel to each other and at substantially 45° angles relative to a side of the metal element, the side of the metal element being substantially parallel to a direction of current flow through the metal element.

10. The apparatus of claim 9, wherein each rhombic slot has a third side and a fourth side that are substantially parallel to each other and perpendicular to the first and second sides of said each rhombic slot, the third and fourth sides being at 45° angles relative to the side of the metal element.

11. A automated method for designing a rhombic reverse fill pattern for a metal layer of an integrated circuit (IC), the automated method comprising:
   with at least one of software and hardware, selecting a size value and a spacing distance value for rhombic slots of a rhombic reverse fill pattern to meet a target metal density; and
   with a computer aided design tool, generating a rhombic reverse fill pattern design for a metal element of the IC using the selected size and spacing distance values, the reverse fill pattern design including a layer of metal having the rhombic slots formed therein, each rhombic slot being substantially rhombic in shape and having a size corresponding substantially to the selected size value, and wherein adjacent rhombic slots are separated by substantially the selected spacing distance.

12. The automated method of claim 11, wherein the target metal density is related to the size and spacing distance values as $(Y)^2/(2X+Y)^2=1-Z/100$, where Y is the size value, 2X is the spacing distance value and Z is the target metal density stated in terms of a percentage.

13. The automated method of claim 11, wherein each rhombic slot has a first side and a second side that are substantially parallel to each other and at 45° angles relative to a side of the metal element, the side of the metal element being substantially parallel to a direction of current flow through metal the element.

14. The automated method of claim 13, wherein each rhombic slot has a third side and a fourth side that are substantially parallel to each other and substantially perpendicular to the first and second sides of said each rhombic slot, the third and fourth sides being at substantially 45° angles relative to the side of the metal element.

15. A automated method for forming a rhombic reverse fill pattern in a metal layer of an integrated circuit (IC), the automated method comprising:
   receiving a rhombic reverse fill pattern design that meets a target metal density with one of a mask pattern creation system and a metallization system; and
   forming a rhombic reverse fill pattern in a metal layer of the IC having the rhombic reverse fill pattern design with a metallization system, the rhombic reverse fill pattern including a layer of metal having slots formed therein, each slot being substantially rhombic in shape, the metal layer having the substantially rhombic slots formed therein comprising a metal element of the IC.

16. The automated method of claim 15, wherein each slot has a particular size, Y, where Y is a positive value, and wherein adjacent slots are separated by a particular spacing distance, 2X, where X is a positive value, the values for Y and 2X being indicated in the received design.

17. The automated method of claim 16, wherein the target metal density is related to X and Y as $(Y)^2/(2X+Y)^2=1-Z/100$, where Z is the target metal density stated in terms of a percentage.

18. The automated method of claim 15, wherein each rhombic slot has a first side and a second side that are parallel to each other and at 45° angles relative to a side of the metal element, the side of the metal element being parallel to a direction of current flow through the metal element.

19. The automated method of claim 18, wherein each rhombic slot has a third side and a fourth side that are parallel to each other and perpendicular to the first and second sides of said each rhombic slot, the third and fourth sides being at 45° angles relative to the side of the metal element.

20. A computer program for generating a rhombic reverse fill pattern design for a metal element of an integrated circuit, the rhombic reverse fill pattern design including a layer of metal having slots formed therein, the computer program comprising instructions for execution by a processor, the instructions being stored on a computer-readable medium, the computer program comprising:
   instructions for receiving input that describes an integrated circuit design;
   instructions for receiving user input including a size value corresponding to a size of each slot and a spacing distance value corresponding to a spacing distance between adjacent slots, wherein each slot is substantially rhombic in shape; and
   instructions for generating a substantially rhombic reverse fill pattern design based on the received user input.

21. A computer program for controlling a metallization process to form a rhombic reverse fill pattern in one or more metal layers of an integrated circuit, the rhombic reverse fill pattern comprising a layer of metal having slots formed therein, the computer program comprising instructions for execution by a processor, the instructions being stored on a computer-readable medium, the computer program comprising:
   instructions for receiving a rhombic reverse fill pattern design, the rhombic reverse fill pattern design including a size value corresponding to the size of each slot and a spacing distance value corresponding to a spacing distance between adjacent slots, wherein each slot is substantially rhombic in shape; and
   instructions for generating control signals for controlling a metallization machine to cause the metallization machine to form a substantially rhombic reverse fill pattern having the received rhombic reverse fill pattern design in one or more metal layers of the integrated circuit.

22. An integrated circuit (IC) device having at least one metal element that has a substantially rhombic reverse fill pattern, the substantially rhombic reverse fill pattern including a layer of metal having slots formed therein, each slot being substantially rhombic in shape.

23. An integrated circuit (IC) device having at least one metal element that has a substantially rhombic reverse fill pattern, the substantially rhombic reverse fill pattern including a layer of metal having slots formed therein, each slot being substantially rhombic in shape, and wherein the substantially rhombic reverse fill pattern meets a target metal density.

24. An integrated circuit (IC) device having at least one metal element that has a substantially rhombic reverse fill pattern, the substantially rhombic reverse fill pattern including a layer of metal having slots formed therein, each slot being substantially rhombic in shape, and wherein the substantially rhombic reverse fill pattern meets a target metal density without increasing electromigration (EM) in the metal element.

25. An integrated circuit (IC) device having at least one metal element that has a substantially rhombic reverse fill pattern, the substantially rhombic reverse fill pattern including a layer of metal having slots formed therein, each slot being substantially rhombic in shape, and wherein the substantially rhombic reverse fill pattern meets a target metal density without increasing IR drop.

* * * * *